United States Patent [19]

Sachdev

[11] Patent Number: 5,625,300
[45] Date of Patent: Apr. 29, 1997

[54] SEPARATE $I_{DDQ}$-TESTING OF SIGNAL PATH AND BIAS PATH IN AN IC

[76] Inventor: Manoj Sachdev, Groenewoudseweg 1, 5621 BA Eindhoven, Netherlands

[21] Appl. No.: 355,569

[22] Filed: Dec. 14, 1994

[30] Foreign Application Priority Data

Dec. 16, 1993 [EP] European Pat. Off. .............. 93203546
Feb. 28, 1994 [EP] European Pat. Off. .............. 94200505

[51] Int. Cl.⁶ ............................................. G01R 31/26
[52] U.S. Cl. ................. 324/765; 324/769; 324/158.1; 324/73.1; 371/22.5
[58] Field of Search ................... 324/769, 765, 324/158.1, 73.1; 371/15.1, 22.1, 22.5; 364/481

[56] References Cited

U.S. PATENT DOCUMENTS

| | | | |
|---|---|---|---|
| 4,542,340 | 9/1985 | Chakravarti et al. | 324/769 |
| 4,835,458 | 5/1989 | Kim | 324/73.1 |
| 5,057,774 | 10/1991 | Verhelst et al. | |
| 5,325,054 | 6/1994 | Houston | 324/769 |
| 5,392,293 | 2/1995 | Hsue | 371/15.1 |

OTHER PUBLICATIONS

"Ultra Low Power CMOS Technology", Proc. 3–rd NASA Symposium on VLSI Design, 1991, pp. 1–11. Month unavailable.

"Design and Test Rules for CMOS Circuits to Facilitate IDDQ Testing of Bridging Faults", K.J. Lee and M.A. Breuer, IEEE Transactions on Coomputer–Aided Design, vol. II, No. 5, May 1992, pp. 659–669.

"Impact of Silicon Substrates on Leakage Currents", J.W. Slotboom, M.J.J. Theunissen and A.J.R. deKock, IEEE Electron Device Letters, vol. EDL–4, No. 11, Nov. 1983, pp. 403–406.

*Primary Examiner*—Kenneth A. Wieder
*Assistant Examiner*—Kourosh Cyrus Khosravi

[57] ABSTRACT

An IC is tested through $I_{DDQ}$-measurements. The IC's substrate includes a region of a conductivity type with a supply node for supply of the circuit and with a biasing node for connection to a biasing voltage to bias the region. $I_{DDQ}$-testing of the circuit is conducted while the supply node and the biasing node are galvanically disconnected to separate the contribution to the quiescent current from the circuit functionality features from the contribution to the quiescent current from the biasing features.

10 Claims, 5 Drawing Sheets

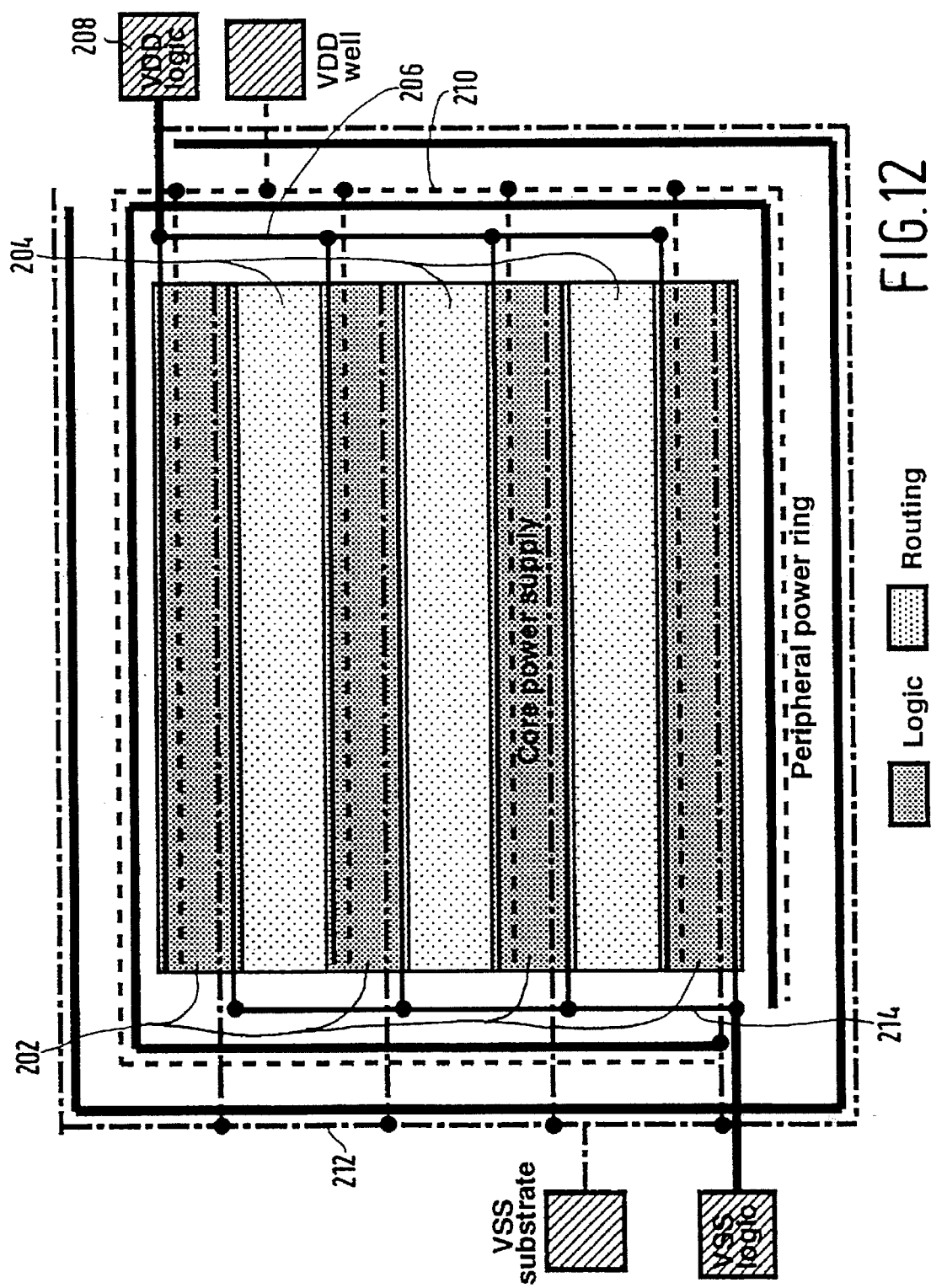

SEPARATE $I_{DDQ}$-TESTING OF SIGNAL PATH AND BIAS PATH IN AN IC

FIELD OF THE INVENTION

The invention relates to a method of testing an electronic circuit integrated in a semiconductor substrate. The substrate comprises a region of a conductivity type with a supply node for supply of the circuit and with a biasing node for connection to a biasing voltage to bias the region. The method includes determining a quiescent current through the circuit.

BACKGROUND ART OF THE INVENTION

Systematic and automatic testing of electronic circuitry, and of integrated circuits in particular, has become increasingly more important. Each next generation of circuits tends to develop ever larger component densities and an ever growing number of system functionalities. Individual circuits have become complicated to such an extent that process defects cannot be detected and located anymore save by exhaustive and expensive testing. Customers cannot be expected to accept circuitry products that show their hidden defects in operational use, thereby rendering systems unreliable. It is therefore of the utmost importance for both the manufacturer and the customer that tests are run to guarantee flawless operation of the circuit products.

Quiescent-current testing ($I_{DDQ}$-testing), also referred to as current supply monitoring method (CSM), of an integrated circuit aims at locating process defects in the circuit by monitoring the quiescent currents. For some details on $I_{DDQ}$-testing, see "Design and Test Rules for CMOS Circuits to Facilitate $I_{DDQ}$ Testing of Bridging Faults", K.-J. Lee and M. A. Breuer, IEEE Transactions on Computer-Aided Design, Vol. II, No. 5, May 1992, pp. 659–669. The $I_{DDQ}$-testing technique has shown a lot of promise in the analysis of actual process detects, typically in static CMOS ICs. The quiescent current, or steady state current, in a CMOS logic circuit should be very small, e.g., in the order of 1 µA. Any deviation may therefore be easily detected. The potential of this testing technique is substantial in terms of cost reduction, and of quality and reliability enhancement.

Stuck-at faults are symptoms caused by unintended electrically conductive interconnections between circuit nodes and supply lines, thereby effecting a hard-wired pull-up or pull-down that interferes with the logic operation. A bridging fault formed by a conductive bridge of low resistance between a supply line and a signal line causes stuck-at phenomena. Impact of gate-oxide defects is often parametric in nature, i.e., not defined in terms of logic voltage levels, and is therefore often not detected by conventional voltage methods. Gate-oxide defects may also give rise to stuck-at behaviour.

It is an object of the invention to provide an $I_{DDQ}$-testing method that more accurately diagnoses the measured quiescent current. It is another object to provide an $I_{DDQ}$-testing method that discriminates between origins of quiescent currents.

SUMMARY OF THE INVENTION

To this end, the invention provides a method as introduced in the preamble, characterized in that the determining of the quiescent current comprises determining a magnitude of a current through a single one of said nodes.

In $I_{DDQ}$-testing the decision to approve or refuse an electronic circuit is made on the basis of extremely small measured current values. Conventionally, a typical quiescent current of 10 µA or larger is interpreted as being indicative of a faulty device, while a defect-free device would produce a quiescent current of at least an order of magnitude smaller. The invention is based on the insight that a large quiescent current need not imply that the circuit's functional operation should be incorrect, as such currents could well stem from causes other than processing defects. A leakage or substrate current, occurring at p-n junctions, can give rise to a quiescent current of substantial magnitude in a properly operating electronic device. For example, the magnitude of a leakage current density for a non-epitaxial substrate typically lies in the order of $10^{-6}$ A/cm$^2$. See, for example, "Impact of Silicon Substrates on Leakage Currents", J. W. Slotboom, M. J. J. Theunissen and A. J. R. de Kock, IEEE Electron Device Letters, Vol. EDL-4, No. 11, Nov. 1983, pp. 403–406. The quiescent current might also be due to the quality of the base wafer, the processing to which the wafer has been submitted, or by a poor positioning of the substrate and well contacts. All these leakage currents do not directly affect the functional operation itself of the electronic circuit, e.g., logic operation in digital circuitry or signal handling in analog circuitry. For non-battery operated devices, current leakage has only minor consequences with regard to lifetime expectancy and operational use.

Accordingly, rejecting an electronic device as a faulty device merely on the basis of it giving rise to a large steady state current under conventional $I_{DDQ}$-testing is not always correct. Therefore, the invention separates the testing of the quiescent current through the supply node from the testing of the current through the bias node, e.g., by having said nodes galvanically disconnected from one another during testing. Galvanically disconnected is to be understood as there being no short circuit between said nodes so that currents through said nodes, representative of the electronic circuit's functional operation, can be individually measured. That is, the current path through the supply nodes is functionally separated from the current path through the bias nodes to discriminate between the two currents during testing. The steady state current through the supply nodes is a better indication of the circuit's operational fitness than the aggregate steady state current through the bias nodes and supply nodes combined. According to the invention, the yield of a manufacturing process is effectively increased by discriminating between the leakage current across the p-n junctions and the supply current for the circuit's functional operation. In other words, the testing in accordance with the invention also classifies devices as functioning correctly, which otherwise would have been discarded by conventional $I_{DDQ}$-tests.

The circuit's functional operation is tested by determining the quiescent currents through the supply nodes. The leakage currents are tested by determining the current through the bias nodes. Note that the galvanic separation between the supply nodes and the bias nodes renders the circuit testable under a variety of combinations of supply voltages and bias voltages different from the supply voltage.

It is noted that J. Burr and A. Peterson, in "Ultra Low Power CMOS Technology", Proc. 3-rd NASA Symposium on VLSI Design, 1991, pp. 1–11, discuss implementations of digital circuitry at very low supply voltages, i.e., in the order of a few hundred millivolts. The energy per operation in massively parallel signal processors is sought to be reduced. PFET gates are doped p+ and NFET gates are doped n+. If the channel implant is excluded, both devices have thresholds close to zero volts. The thresholds then can be adjusted by adjusting the substrate bias voltage. This arrangement requires that at least one of the bias nodes is galvanically separated from the supply nodes. However, the node separation in this prior art circuit applies to the functional operation of an ultra-low voltage supply digital circuit. In the present invention, the node separation is implemented in a circuit to enable a particular way of testing. Here, the nodes are typically connected to a fixed supply voltage of e.g., 5 Volts or 3.3 Volts or 2.7 Volts in normal operation. That is the circuit in the present invention operates under a supply voltage that is substantially higher than 1 Volt. No threshold adjustment in operational use is required here.

The measurement of quiescent currents in a circuit requires very sensitive measuring devices. For this purpose so-called Built-In-Current (BIC) sensors have been developed that can be integrated in the circuit. An example of a circuit arrangement for a BIC sensor can be found in U.S. Pat. No. 5,057,774. A BIC sensor can be employed for measuring the quiescent current through the supply node and for measuring the quiescent current through the bias node.

BRIEF DESCRIPTION OF THE DRAWING

The invention is explained below by way of example and with reference to the accompanying drawing, wherein:

FIG. 12 shows the organization of the supply lines for an integrated circuit, containing electronic devices according to the invention.

Throughout the drawing like reference numerals indicate similar or corresponding features.

DESCRIPTION OF THE PREFERRED EMBODIMENTS

Figure 1:
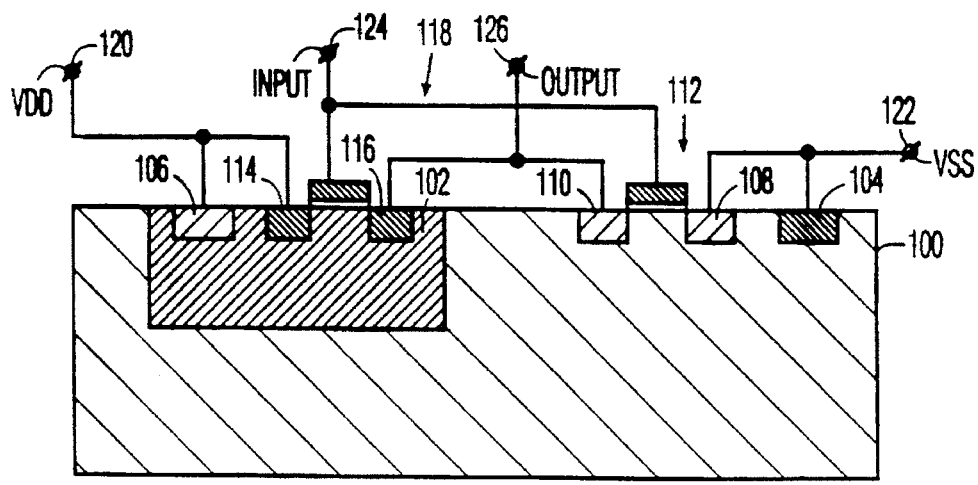
FIG. 1 gives an example of an electronic device during testing in the prior art.

FIG. 1 shows a schematic cross section of a portion of a p⁻-semiconductor substrate 100 with an n-well 102 of a prior art device fabricated in an n-well process. The p⁻-substrate 100 is provided with a substrate contact 104, in this example typically doped p⁺. The n-well 102 is provided with a well contact 106, in this example, typically doped n⁺. Further, a source 108 and a drain 110 for an NFET 112 are formed in substrate 100 and a source 114 and a drain 116 for a PFET 118 are formed in n-well 102. NFET 112 and PFET 118 are interconnected as a logic gate of the CMOS inverter type, with input 124 and output 126. The formation of NFETs and PFETs and the creation of logic gates are well known in the art and are not further discussed here. Typically, Source 144 of PFET 118 serves as a supply node to be connected to supply voltage VDD at a terminal 120, VDD being the higher one of supply voltages VDD and VSS, whereas source 108 of NFET 112 serves as a supply node to be connected to VSS at a terminal 122, VSS being the lower one of the supply voltages VDD and VSS.

In order to prevent the p-n junctions between substrate 100 on the one side and source 108 and drain 110 on the other side from conducting, substrate contact 104 connects substrate 100 to VSS, thereby serving to bias substrate 100. In order to avoid conduction between n-well 102 and substrate 100 and between n-well 102 and source 114 and drain 116, well Contact 106 connects n-well 102 to VDD, thereby biasing n-well 102.

The quiescent current through the Circuit is conventionally determined by measuring the current in the path, between VDD terminal 120 and VSS terminal-122. That is, the current stemming from, e.g., a bridging defect in the interconnections between transistors 112 and 118 as well as the leakage current through substrate 100, e.g., the current through the p-n junction of n-well 102 with substrate 100 are measured combined.

Figure 2:
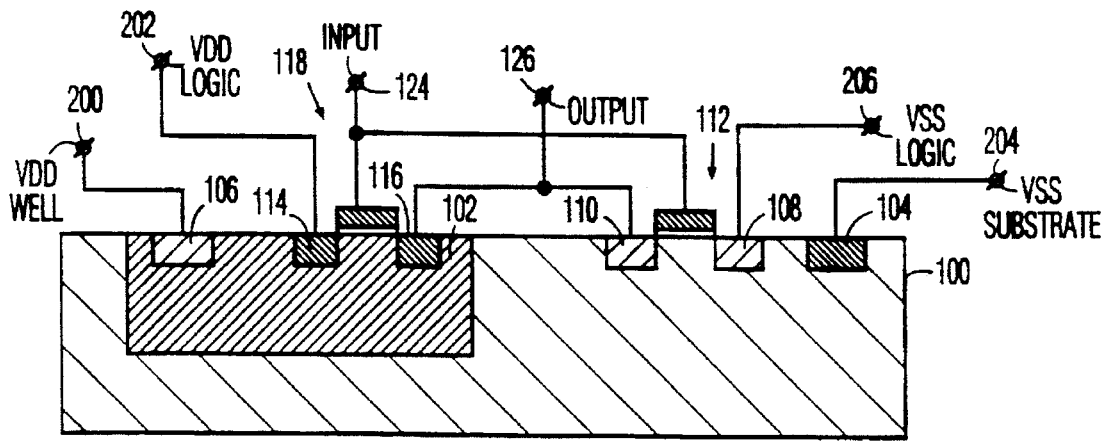
FIGS. 2, 3 and 4 discuss examples of an electronic device for testing according to the invention.
Figure 3:
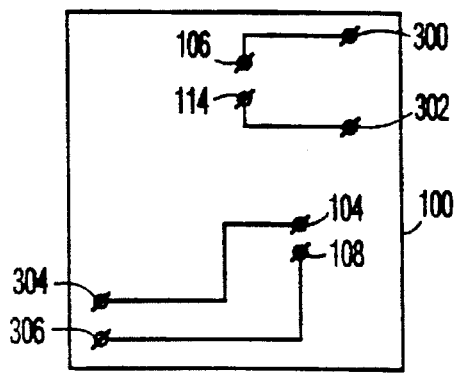

FIG. 2 shows a schematic cross section of a portion of a p⁻-semiconductor substrate 100 with an n-well 102 of a device according to the invention and fabricated in an n-well process. During $I_{DDQ}$-testing in the invention, n-well contact 106 and supply contact 114 are connected to different VDD supply terminals 200 and 202, respectively, and substrate contact 104 and source 108 are connected to different VSS supply terminals 204 and 206, respectively. As a consequence, a first contribution to the steady state current arising from defects in the transistors and interconnections between the transistors can be measured separately from a second contribution to the steady state current stemming from ever present parasitic effects inherent to the technology. The first contribution is determined by measuring the current through the path between terminals 202 and 206, whereas the second contribution is determined by measuring the current in the path between terminals 200 and 204. The galvanic separation of supply nodes 114 and 108 and bias nodes 106 and 104 can be brought about in a variety of ways. A first option is to provide separate bonding pads on the substrate. FIG. 3 shows a schematic arrangement of substrate 100 on top provided with a bias bonding pad 300 connected to n-well contact 106, a supply bonding pad 302 connected to supply node 114, a bias bonding pad 304 connected to substrate contact 104 and a VSS supply bonding pad 306 connected to supply node 108. Substrate 100 may be a wafer or chip. After testing has ensured that the circuit is acceptable, substrate 100 is provided with a lead frame and is encapsulated. Bonding pads 300 and 302 may be connected to different connection pins of the lead-frame or to the same connection pin using double bonding. Similarly, bonding pads 304 and 306 may be connected to different connection pins of the lead-frame or to the same connection pin using double bonding. When double bonding is used, the testing according to the invention cannot be carried out anymore.

Figure 4:
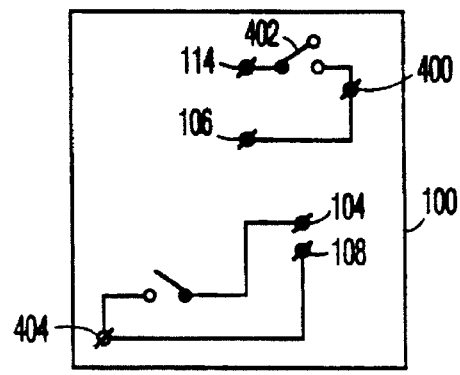

FIG. 4 shows a second option to functionally include a switch 402 in at least one of the connections between a supply node (e.g., node 114) and a bonding pad (e.g., 400) and between a bias node (e.g., 106) and the same bonding pad (e.g., 400). Switch 402 can be, for example, program controlled through dedicated on-chip circuitry (not shown) or is controlled by an external agent. In the drawing, switch 402 is located between a supply node (e.g., 114) and the bonding pad, whereas the bias node remains connected to the bonding pad. In this manner, the circuit can functionally be disabled in order to determine the leakage current.

Assume that substrate 100 contains a circuit, e.g., a microprocessor, with a plurality of subsidiary circuits (not shown), such as a CPU, a memory, a bus interface, a register, etc. Switches such as switch 402 can also be arranged individually between each of the subsidiary circuits and the supply terminals and bias terminals in order to selectively enable a particular one of the subsidiary circuits for monitoring the quiescent current in the particular subsidiary circuit. This permits a locating of the possible defects.

FIGS. 5, 6, 7, 8, 9 and 10 schematically picture substrate 100 of FIG. 2 to illustrate representative examples of measuring strategies by combining terminals 200, 202, 204 and 206 in different configurations for determining the corresponding quiescent currents. The p-n junctions in substrate 100 are represented by diodes D1, D2, D3, D4, D5, D6 and D7. D1 represents the diode between the $p^+$-region of source 114 and $n^-$-well 102. D2 represents the diode between n-well 102 and the $p^+$-region of drain 116. D3 represents the diode between the $n^+$-region of drain 110 and $p^-$-substrate 100. D4 represents the diode between $p^-$-substrate 100 and the $n^+$-region of source 108. D5 represents the diode between $n^-$-well 102 and $p^-$-substrate 100. When NFET 112 is conducting there exists a diode between its conduction channel and the $p^-$-substrate 100; this diode is represented by D6. When PFET 118 is conducting there exists a diode between its conduction channel and $n^-$-well 102; this diode is represented by D7.

Figure 5:
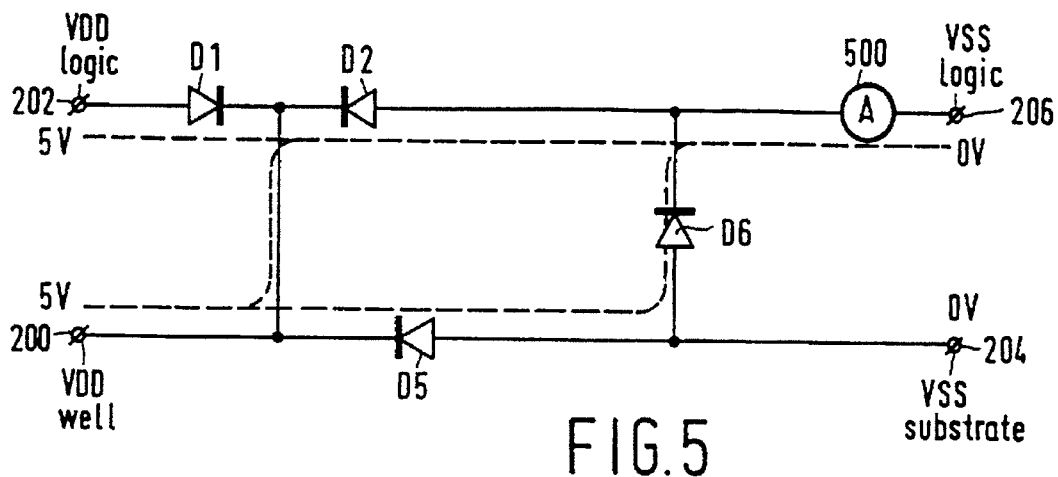
FIGS. 5, 6, 7, 8, 9 and 10 give representative examples of the test strategies rendered feasible by the invention.

FIG. 5 shows a first option to determine a quiescent current flowing into terminal 206. Terminals 200 and 202 are kept at, e.g., 5 Volts or 3 Volts, terminals 204 and 206 are grounded and input 124 is set to high. Because NFET 112 now conducts, D3 and D4 have disappeared and diode D6 is in existence. A current measuring device 500 is arranged in the current branch near terminal 206. The subsidiary currents contributing to the aggregate current flowing into terminal 206 are represented by dashed lines. This first option gives information about, e.g., the interconnections between transistors 112 and 118. Note that, owing to terminals 200 and 202 being galvanically disconnected, the voltages at terminals 200 and 202 can be chosen to be mutually different.

Figure 6:
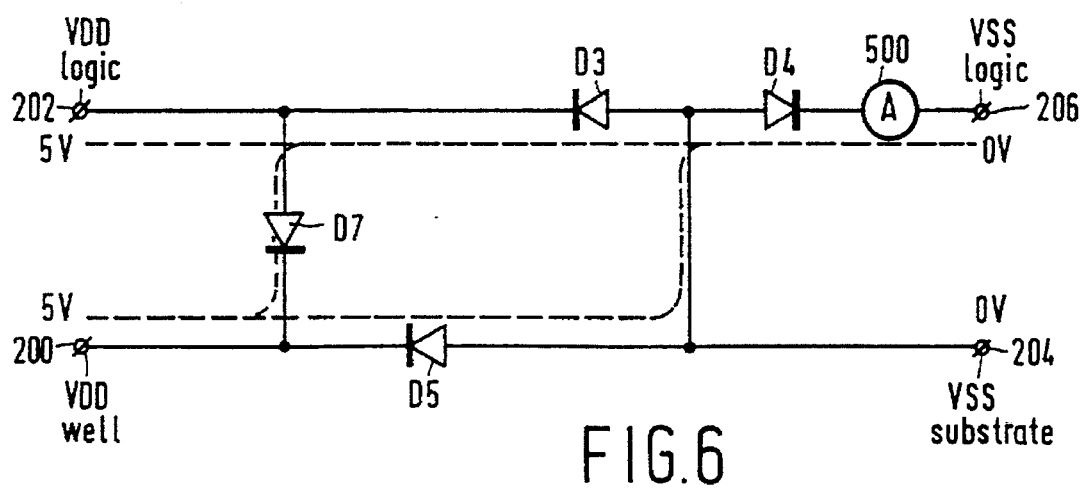

FIG. 6 shows the same set-up as FIG. 5, but now input 124 is set to low. Because PFET 118 now conducts, D1 and D2 have disappeared and D7 exists. NFET 112 is not conducting resulting in D3 and D4 and the disappearance of D6.

Figure 7:
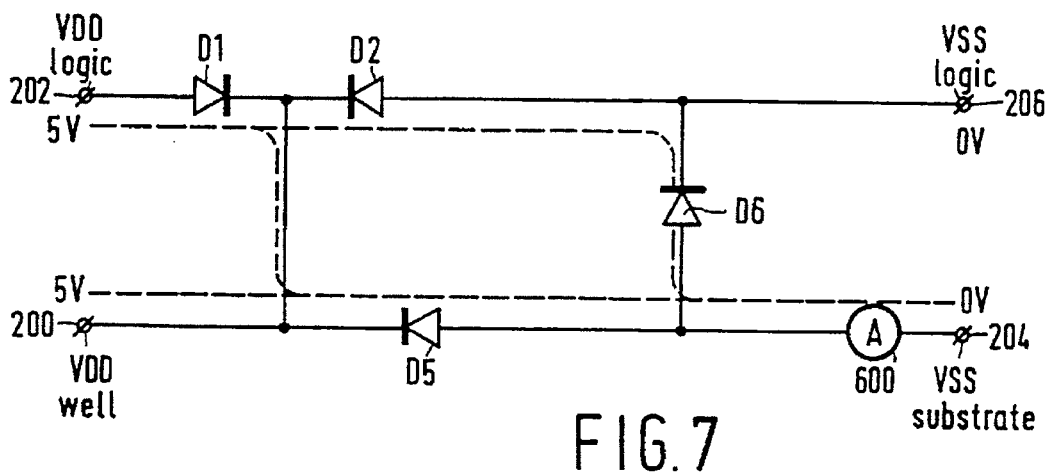

FIG. 7 shows a second option to determine a quiescent current flowing into terminal 204. Terminals 200 and 202 are kept at, e.g., 5 Volts or 3 Volts, terminals 204 and 206 are grounded and input 124 is set to high. NFET 112 is then conducting, resulting in diode D6, and PFET 118 is not conducting, resulting in diodes D1 and D2. A current measuring device 600 is arranged in the current branch near terminal 204. The subsidiary currents contributing to the aggregate current flowing into terminal 204 are represented by dashed lines. The second option informs about, e.g., the p-n junctions of n-well 102 and of substrate contact 104.

Figure 8:
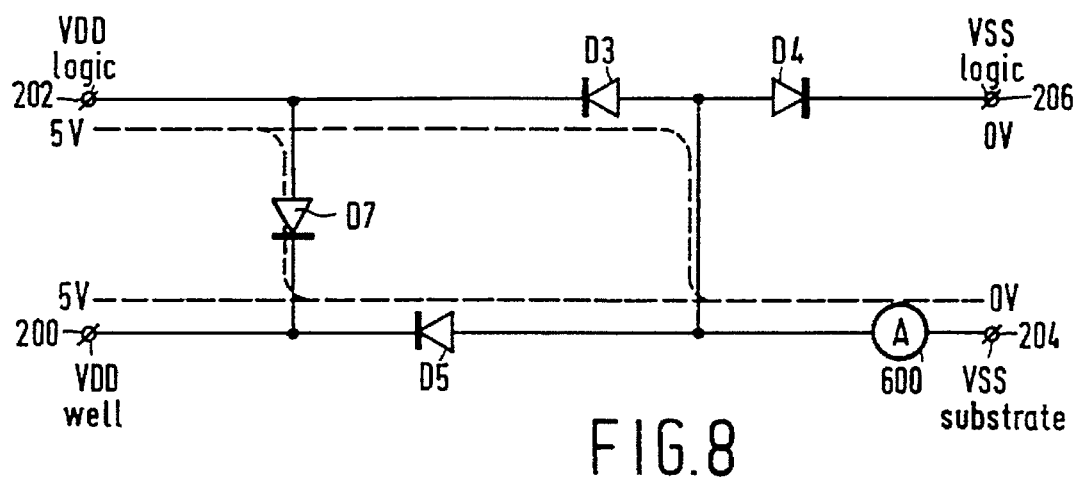

FIG. 8 shows the same set-up as FIG. 7 but now input 124 is set to low. This makes PFET 118 conducting, resulting in diode D7, and NFET 112 not conducting, resulting in diodes D3 and D4.

Figure 9:
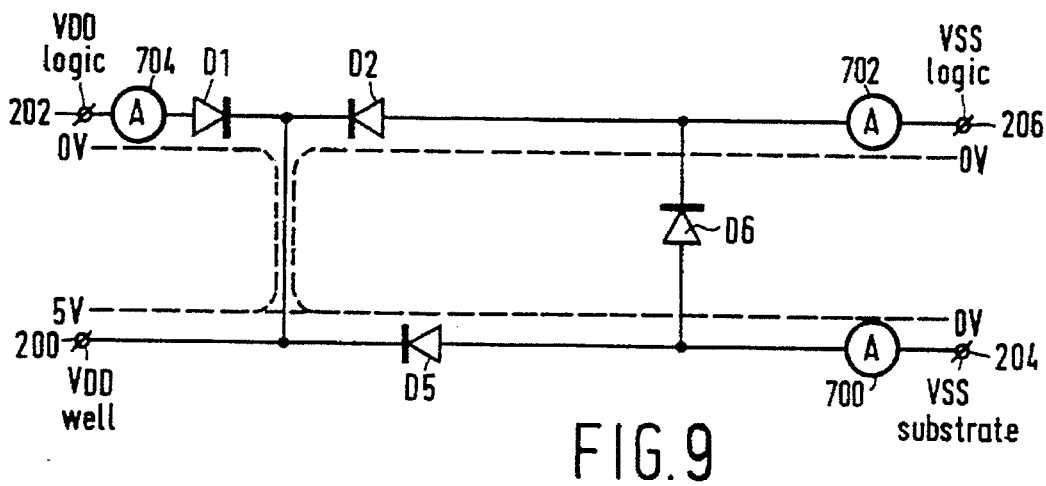

FIG. 9 shows a third option to determine a quiescent current flowing into terminal 206. Terminals 200 is kept at, e.g., 5 Volts, terminals 202, 204 and 206 are grounded and input 124 is set to high. NFET 112 is then conducting, resulting in diode D6, and PFET 118 is not conducting, resulting in diodes D1 and D2. Current measuring devices 700, 702 and 704 are arranged in the current branches near terminals 204, 206 and 202, respectively. The subsidiary currents contributing to the aggregate current flowing into terminal said terminals are represented by dashed lines. Combining the measurements informs about various p-n junctions and interconnections individually.

Figure 10:
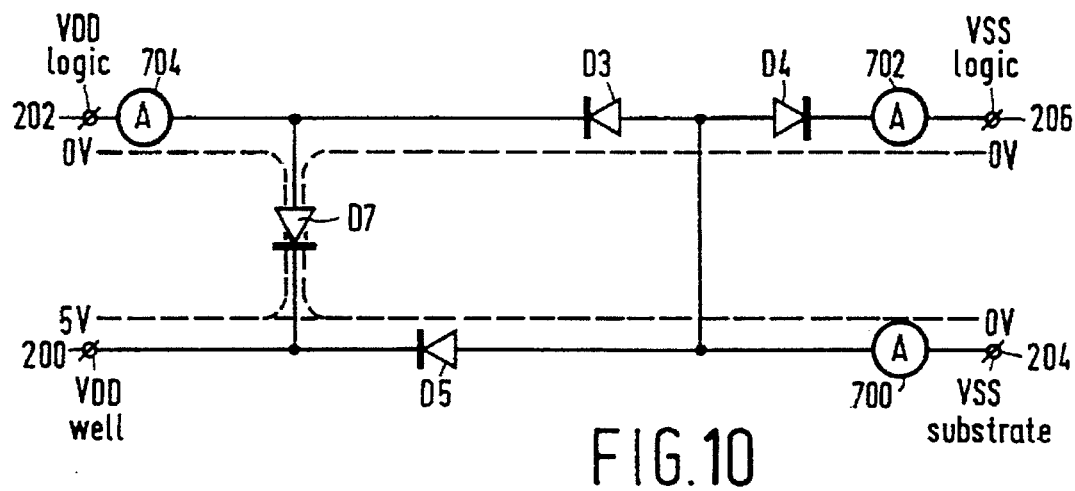

FIG. 10 shows the same set-up as FIG. 9 but now input 124 is set to low. This makes PFET 118 conducting, resulting in diode D7, and NFET 112 not conducting, resulting in diodes D3 and D4.

Figure 11:
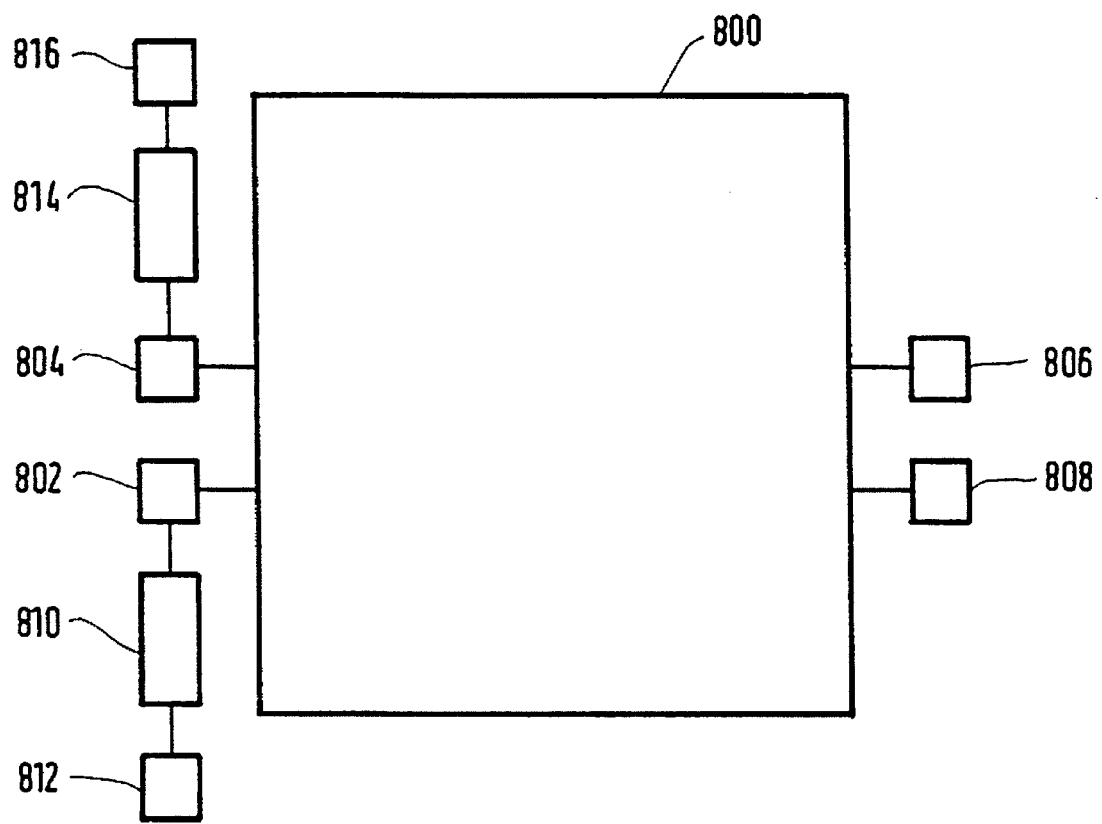
FIG. 11 gives an example of Built-In-Current sensors for measuring quiescent currents.

FIG. 11 schematically pictures an overall chip lay-out 800 with supply pads 802, 804, 806 and 808 for the respective supply of $VSS_{logic}$, $VSS_{substrate}$, $VDD_{logic}$ and $VDD_{well}$. A BIC sensor 810 is connected between pad 802 and pad 812 and another BIC sensor 814 is connected between pad 804 and pad 816. A BIC sensor measures the current that flows through it and delivers its measurements by means of some logic that is not further described in here. Refer to U.S. Pat. No. 5,057,774 for details of the BIC sensor. In a normal mode the circuit will receive the various types of supply directly on the pads 802, 804, 806 and 808; the BIC sensors are not in any supply line and are not active. In this way, a BIC sensor has no detrimental effect on the operational, behavior of the circuit. In a test mode, when measuring the quiescent currents, the supply of $VSS_{logic}$ will take place via pad 812, thereby bringing in the BIC sensor 810 and the supply of $VSS_{substrate}$ will take place via pad 816, thereby bringing in the BIC sensor 814. Quiescent current measuring can now be done using the two sensors as measuring devices.

The IDDQ-testing can be carried out on the die as well as on the packaged circuit. Based on the results of testing the die it will be decided to reject or to package the die. With respect to bonding the supply pads to external pins various options are available, including:

bonding the pads 802, 804, 806, 808, 812 and 816 to respective external pins; full functionality for measuring the quiescent current through the nodes and through the substrate separately remains available after packaging, including the usage of the BIC sensors;

bonding the pads 802, 804, 806 and 808 to respective external pins and discarding pads 812 and 816; full functionality for quiescent current measuring remains but the BIC sensors can not be used any more after packaging;

bonding the pads 802 and 804 together to one external pin, bonding pad 806 and 808 together to another external pin, and discarding pads 812 and 816; only the possibility for traditional IDDQ-testing remains available after packaging and the current through the node and through the substrate can not be measured separately.

What option to use is the result of a trade-off between the number of additional pins on the package and the need and organization of IDDQ testing during the operational lifetime.

The example of the usage of BIC sensors connected to supply pads in FIG. 11 includes 2 sensors for 2 specific pads. Other combinations of sensors and pads, and combinations with another number of sensors are also possible.

FIG. 12 shows the organization of the supply lines on the level of an integrated circuit, which contains a number of electronics circuits that make use of the invention. Logic channels 202 are provided to hold electronic circuits. A cross section of an example of such an electronic circuit is given in FIG. 2. Routing channels 204 are provided to hold wires that interconnect the electronic circuits in such a way that the overall integrated circuit performs its desired function. An electronic circuit according to the invention requires four different power connections. These are provided by four parallel supply lines that run in she logic channel 202. The first supply lines of the different logic channels are connected together and form a mesh 206, which is connected to a bonding pad 208 for external connection. Similar meshes 210, 212 and have been realized for the Other supply lines.

It is clear to the person skilled in the art that the testing of circuitry according to the invention can be carried out regardless of the circuit being fabricated in a p-well technology, an n-well technology, or in a twin-well technology, and regardless of the circuit being implemented with only one type of field effect transistors (e.g., NMOS, PMOS), two complementary types (e.g., CMOS) or with bipolar transistors and complementary field effect transitors (e.g., BiCMOS).

I claim:

1. A method of testing an active electronic circuit integrated in a semiconductor substrate, wherein the substrate comprises a region of a first conductivity type with a first supply node for supply of the active electronic circuit and with a first biasing node for connection to a first biasing voltage to bias the region, and wherein the method includes determining a quiescent current through the active electronic circuit, characterized in that the determining of the quiescent current comprises determining a magnitude of a current through a single one of said nodes.

2. The method of claim 1, wherein the substrate comprises a second region of a second conductivity type, opposite to the first conductivity type; wherein the second region comprises a second supply node and a second biasing node for connection to a second biasing voltage to bias the second region; and wherein the magnitude of the current comprises at least one of the following:

determining the magnitude of the current flowing from the first supply node into the second supply node;

determining the magnitude of the current flowing from the first biasing node into the second biasing node;

determining the magnitude of the current flowing through the first supply node and the first biasing node combined into the second supply node; and determining the magnitude of the current flowing through the first supply node and the first biasing node combined into the second biasing node.

3. The method of claim 1, wherein the first supply node and the first biasing node are galvanically disconnected from one another during testing.

4. The method of claim 1, characterized in that the current through at least a single one of said nodes can be determined with a Built-In-Current sensor which is integrated in the substrate.

5. An electronic circuit for operating with a supply voltage substantially higher than 1 Volt, the electronic circuit having a semiconductor substrate comprising at least one region of a conductivity type with a supply node for supply of the circuit and with a biasing node for connection to a biasing voltage to bias the region, characterized in that the bias node and the supply node are one of galvanically disconnected and galvanically disconnectable from one another.

6. The circuit of claim 5, wherein the bias node is connected to a bias bonding pad and the supply node is connected to a supply bonding pad.

7. The circuit of claim 5, wherein the supply node is reversibly disconnectable from a supply bonding pad and wherein the bias node is connected to the supply bonding pad.

8. The circuit of claim 5, being mounted on a lead frame having connection pins and being encapsulated, the lead frame having a first connection pin galvanically connected to the bias node and having a second connection pin galvanically connected to the supply node.

9. The circuit of claim 5 wherein at least one of the supply node and the bias node is connected to a Built-In-Current sensor.

10. An integrated circuit comprising a number of parallel channels in which a plurality of electronic circuits each having a semiconductor substrate comprising at least one region of a conductivity type with a supply node for supply of the circuit and with a biasing node for connection to a biasing voltage to bias the region, characterized in that the bias node and the supply node are one of galvanically disconnected and galvanically disconnectable from one another, in that each channel contains four parallel supply lines all running lengthwise with respect to the channel for supplying the electronic circuits in the channel, of the four lines a first line for supplying a first plurality of supply nodes, a second line for supplying a first plurality of bias nodes, a third line for supplying a second plurality of supply nodes and a fourth line for supplying a second plurality of bias nodes, in that the first supply lines of all channels are interconnected by a first connection line located outside the area of the channels, forming a first mesh which is connected to a first bonding pad, and in that second, third and fourth meshes and bonding pads are formed for the second, third and fourth supply lines.

* * * * *